(12) United States Patent
Ma et al.

(10) Patent No.: US 6,987,682 B2
(45) Date of Patent: Jan. 17, 2006

(54) MATCHLINE SENSE CIRCUIT AND METHOD

(75) Inventors: Stanley Jeh-Chun Ma, Gloucester (CA); Peter P. Ma, Ottawa (CA); Valerie Lines, Ottawa (CA); Peter Gillingham, Kanata (CA); Robert McKenzie, Ottawa (CA); Abdullah Ahmed, Scarborough (CA)

(73) Assignee: MOSAID Technologies Incorporated, Kanata (CA)

( * ) Notice: Subject to any disclaimer, the term of this patent is extended or adjusted under 35 U.S.C. 154(b) by 155 days.

(21) Appl. No.: 10/258,580

(22) PCT Filed: May 1, 2001

(86) PCT No.: PCT/CA01/00628

§ 371 (c)(1),
(2), (4) Date: Mar. 10, 2003

(87) PCT Pub. No.: WO01/84555

PCT Pub. Date: Nov. 8, 2001

(65) Prior Publication Data

US 2003/0161194 A1    Aug. 28, 2003

(30) Foreign Application Priority Data

May 1, 2000    (CA)    .................................. 2307240

(51) Int. Cl.
G11C 15/00    (2006.01)
G11C 7/00    (2006.01)
(52) U.S. Cl. ........................................ 365/49; 365/203

(58) Field of Classification Search .................. 365/49, 365/203, 205, 207; 327/51, 57
See application file for complete search history.

(56) References Cited

U.S. PATENT DOCUMENTS

| 4,445,201 | A | * | 4/1984 | Pricer .......................... 327/57 |
| 5,051,948 | A |   | 9/1991 | Watabe et al. |
| 5,598,115 | A |   | 1/1997 | Holst |
| 5,740,097 | A | * | 4/1998 | Satoh .......................... 365/49 |
| 5,754,463 | A |   | 5/1998 | Henstrom et al. |
| 6,044,005 | A | * | 3/2000 | Gibson et al. ................. 365/49 |
| 6,373,738 | B1 | * | 4/2002 | Towler et al. ................. 365/49 |
| 6,400,594 | B2 | * | 6/2002 | Hata et al. .................... 365/49 |
| 6,430,073 | B1 | * | 8/2002 | Batson et al. ................. 365/49 |
| 6,442,054 | B1 | * | 8/2002 | Evans et al. .................. 365/49 |
| 6,442,090 | B1 | * | 8/2002 | Ahmed et al. ................. 365/49 |

* cited by examiner

*Primary Examiner*—Trong Phan
(74) *Attorney, Agent, or Firm*—Shin Hung; Borden Ladner Gervais LLP

(57) ABSTRACT

A matchline sense circuit for detecting a rising voltage on a matchline of a CAM array is disclosed. the circuit initially precharges a matchline to ground before turning on a current source to supply current to the matchline and raise the voltage of the matchline. A reference matchline sense circuit generates a self-timed control signal to keep the current supply turned on for a predetermined duration of time. Sensed data on the matchlines are latched after the current source is turned off and the matchlines are precharged to ground. Because the matchline sense circuit of the present invention precharges the matchlines to ground instead of the supply voltage, VDD, less power is consumed. By sensing the rise of the matchline voltage to an n-channel transistor threshold potential, the matchline sensing operation speed is increased.

53 Claims, 11 Drawing Sheets

MATCHLINE SENSE CIRCUIT AND METHOD

FIELD OF THE INVENTION

The present invention relates to content addressable memory. In particular, the present invention relates to a matchline circuit and matchline sensing circuit for detecting a signal on a matchline.

BACKGROUND OF THE INVENTION

In many conventional memory systems, such as random access memory, binary digits (bits) are stored in memory cells, and are accessed by a processor that specifies a linear address that is associated with the given cell. This system provides rapid access to any portion of the memory system within certain limitations. To facilitate processor control, each operation that accesses memory must declare, as a part of the instruction, the address of the memory cell/cells required. Standard memory systems are not well designed for a content based search. Content based searches in standard memory require a software based algorithmic search under the control of the microprocessor. Many memory operations are required to perform a search. These searches are neither quick nor efficient in using processor resources.

To overcome these inadequacies an associative memory system called Content Addressable Memory (CAM) has been developed. CAM allows cells to be referenced by their contents, so it has first found use in lookup table implementations such as cache memory subsystems and is now rapidly finding use in networking systems. CAM's most valuable feature is its ability to perform a search and compare of multiple locations as a single operation, in which search data is compared with data stored within the CAM. Typically search data is loaded onto search lines and compared with stored words in the CAM. During a search-and-compare operation, a match or mismatch signal associated with each stored word is generated, indicating whether the search word matches a stored word or not.

A CAM stores data in a matrix of cells, which are generally either SRAM based cells or DRAM based cells. Until recently, SRAM based CAM cells have been most common because of their simple implementation. However, to provide ternary state CAMs, ie. where the match operation returns a "0", "1" or "don't care" result, ternary state SRAM based cells typically require 16 transistors compared to DRAM based cell of 6 transistors. As a result, ternary state SRAM based CAMs have a much lower packing density than ternary DRAM cells.

To provide the desired search and compare function in a DRAM or SRAM based CAM, matchline sensing circuits are required. Each matchline sensing circuit returns the appropriate state of its matchline, and the outputs of each matchline sensing circuit can be subsequently processed to determine the existence and address of a match. A prior art matchline sensing circuit is disclosed in commonly owned Canadian Patent Application No. 2,273,665, filed on Jun. 17, 1999, the contents of which are incorporated herein by reference. In the matchline sensing scheme of the prior art, each matchline is initially precharged high to the fill VDD supply. A matchline will be discharged to ground if the contents of its stored word do not match, or mismatch, the search word, but will remain at the VDD supply if the stored word matches the search word. Each matchline potential level is compared to a fixed reference voltage, and the matchline sensing circuit generates a result from the comparison.

There are several disadvantages in the matchline sensing scheme of the prior art. Charge sharing between the VDD precharged matchline and the CAM cells will cause the matchline potential to fluctuate as a function of the previous cycle search data. This can cause a matchline sense circuit to generate a false result from the subsequent comparison. This problem becomes increasingly significant as CAM array cell densities increase.

To attain higher packing density, CAM cell transistors use minimum feature sizes. Hence the current capacity of a CAM cell to ground a fully precharged matchline is small, resulting in very slow discharge of the matchline, and increasing the overall search and compare operation of the CAM chip. Inherent parasitic capacitance of the matchline compounds this problem, which increases as CAM arrays become larger.

The optimal sensing margin for the matchline sense circuit should be sufficient for the circuit to easily distinguish if the matchline potential level is above or below the reference voltage. This optimal sensing margin is attained at the time when the matchline voltage level has decreased to a potential level well below the reference voltage. Unfortunately, the poor voltage discharge rate of the matchline previously described only allows accurate sensing to be performed at a prolonged time after the matchline voltage begins to fall.

Sensing can be performed at a time shortly after the matchline voltage drops below the reference voltage if the reference voltage is maintained at a precise level. This is difficult to accomplish due to process variations in the fabrication of the CAM chip, which can alter the reference voltage level beyond the original design specifications.

Power consumption of the prior art matchline sense circuit is high since any discharged matchlines must be precharged back to VDD level in preparation for the next search and compare operation. Power consumption can be expressed as $P \approx C_{ML} \times VDD \times \Delta V \times f$ where $C_{ML}$ is the matchline parasitic capacitance, $\Delta V$ is the difference between VDD and the discharged potential level of the matchline at the sensing time and $f$ is the frequency of operation. If $\Delta V$ is large, then the power consumed will be large, possibly exceeding the power dissipation capability of the package. The prior art match line circuit required all search lines to be held at a low logic level during the match line precharge phase. Even if search data did not change substantially during successive search operations considerable power was consumed as search lines were brought low at the beginning of the match line precharge phase and brought high again for the actual search operation.

There is clearly a need for a matchline sensing circuit capable of consuming very little power and detecting matchline potential levels accurately at high speed.

SUMMARY OF THE INVENTION

It is an object of the present invention to obviate or mitigate at least one disadvantage of the prior art. In particular, it is an object of the present invention to provide a less complex sensing circuit, a method of using such a circuit, and a content addressable memory using such a sensing circuit, that detects voltage levels quickly and accurately.

In a first aspect, the present invention provides a sensing circuit for detecting a voltage. The sensing circuit has a sense line initially precharged to a first voltage level. A current source is operatively-connected to the sense line, and a timing circuit is operatively connected to the current source to switch the current source between an on state and an off state to thereby ramp the sense line from the first voltage level to a second voltage level. A sense amplifier can then detect the second voltage level to provide a corresponding output.

Embodiments of the sensing circuit of the present invention provide a precharge circuit to precharge the sense line, which can consist of n-channel or p-channel transistors, precharged high or low as applicable. In a presently preferred embodiment, the timing circuit is a reference sensing circuit that includes a dummy sense line initially precharged to the first voltage level, and a dummy current source operatively connected to the dummy sense line, and to a feedback circuit. The feedback circuit switches the dummy current source between the on state and the off state for ramping the dummy sense line between the first voltage level and the second voltage level, in response to a feedback output. A dummy sense amplifier detects the second voltage level of the dummy sense line, and provides the feedback output to the feedback circuit when the second voltage level is detected. The reference sensing circuit can be precharged as described above for the sensing circuit. In the presently preferred embodiment, the sense amplifier includes a sense transistor coupled between an output node and a source line and having a threshold potential level. The sense transistor is turned on when the sense line potential level reaches the second voltage level. The sense transistor can also be an n-channel or p-channel transistor, as applicable. In a presently preferred embodiment, a propagation delay circuit delays the timing circuit from switching the current source between the on state and the off state. The propagation delay circuit can be a non-inverting buffer, or a capacitor.

The sensing circuit of the present invention can also include a delay circuit for inhibiting the sense transistor from turning on. The delay circuit can include a coupling circuit for forming a conduction path between a tail line and ground, to raise the threshold potential level of the sense transistor. The coupling circuit is at least one transistor connected between the tail line and ground. The delay circuit can also include a current limiting circuit for reducing the current supplied to the sense line by the current source, such as a transistor connected in series with the current source to restrict the supply of current to the sense line when a conduction path between the sense line and the tail line is formed. Generally, the output of the sensing circuit is maintained by a latching circuit, which can be either a full or half latch.

In a further aspect of the present invention, there is provided a method for detecting a voltage level. The method consists of precharging a sense line to a first voltage level, ramping the voltage level of the sense line for a predetermined time from the first voltage level to a second voltage level, detecting the second voltage level of the sense line; and providing an output corresponding to the detected second voltage level.

In yet another aspect of the present invention, there is provided a method for detecting a match or mis-match condition of match lines. This method consists of setting the match lines in the mis-match condition by precharging the match lines to a "miss" voltage level, and ramping only match condition match lines to a "hit" voltage level.

A further aspect of the present invention provides a sensing circuit for detecting a voltage in a content addressable memory. The sensing circuit consists of a first and second voltage supplies with first, second and third transistors of a first type connected in series between the first voltage supply and a match line, the gate of the second transistor of the first type being connected to a bias voltage. A plurality of pairs of series connected search and compare transistors of a second type are connected in parallel between the match line and a tail line. The gate of each search transistor is connected to a search line, the gate of each compare transistor is connected to a memory cell, and the tail line is connected to the gate of the third transistor of the first type. A first transistor of the second type is connected between the match line and the second voltage supply. A second transistor of the second type is connected between an intermediate output node and the tail line, and the gate of the second transistor connected to the match line. A third transistor of the second type is connected between the tail line and the second voltage supply. A first enable signal is connected to the gates of the first transistor of the first type, the first transistor of the second type and the third transistor of the second type. A first logic gate has a first input connected to the intermediate output node, a second input connected to a second enable signal, and an output. A first inverter couples the output to the intermediate output node, and a reference circuit generates the first enable signal.

Another aspect of the present invention provides a content addressable memory. The content addressable memory includes an array of content addressable memory cells arranged in rows and columns, an address decoder, data access circuitry; and a matchline sensing circuit as described above.

BRIEF DESCRIPTION OF THE DRAWINGS

Preferred embodiments of the present invention will now be described, by way of example only, with reference to the attached Figures, wherein.

DETAILED DESCRIPTION OF THE INVENTION

Figure 1:
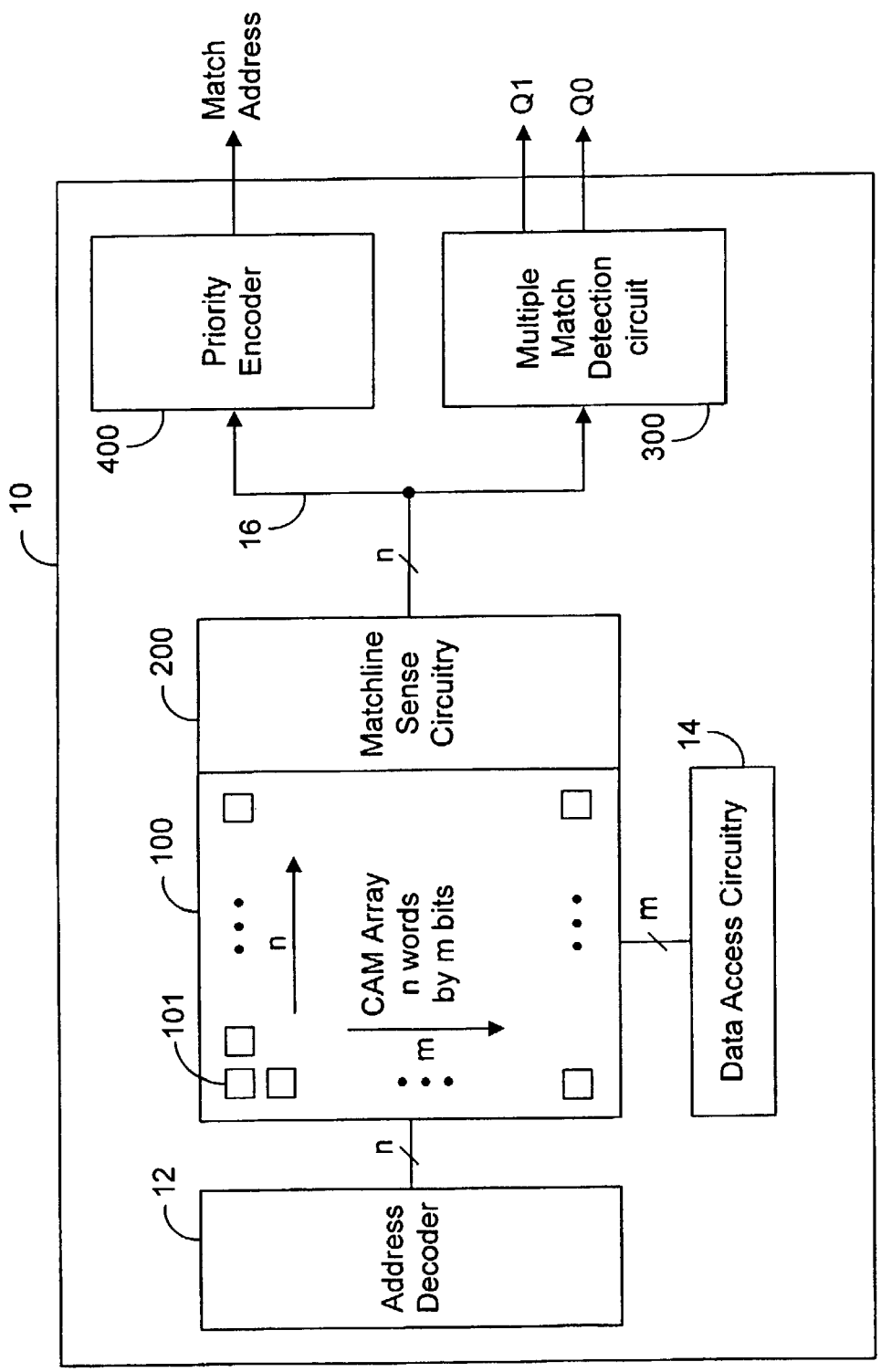
FIG. 1 shows a block diagram of a CAM according to an embodiment of the present invention.

A typical CAM block diagram is shown in FIG. 1. The CAM 10 includes a matrix, or array 100, of CAM cells 101 arranged in rows and columns, where, for a ternary CAM, each cell stores one of three states: logic "1", logic "0" and "don't care", actually storing 2 bits of data. A predetermined number of CAM cells 101 in a row store a word of data. In the CAM array 100 of FIG. 1, there are n rows and m columns, where n and m are integer numbers. An address decoder 12 is used to select any row within the CAM array 100 to allow data to be written into or read out of the selected row although most commonly, data is written or loaded into the CAM and searched. The bidirectional data access circuitry 14 transfers data (DATA) between the CAM array 100 and the data pins (not shown) of the CAM chip, for access by an external processor. Located adjacent to the CAM array 100 for each row is matchline sense circuitry block 200. Matchline sense circuitry block 200 comprises n matchline sense circuits and is used during search-and-compare operations for outputting an n-bit result 16 indicating a successful or unsuccessful match of a search word against the stored word. The matchline sense circuitry block results 16 for all rows are processed by the priority encoder 400 to generate an address (Match Address) corresponding to the location of a matched word. Since it is possible that more than one row will match the search word, the priority encoder 400 generates the lowest physical address corresponding to a matched word. Acting in parallel with the priority encoder 400 is a multiple match detection circuit 300, which assesses the matchline sense circuit results 16, and produces a two bit output Q1, Q0 representing the cases where there are no matches, only one match and two matches or more.

Figure 2:
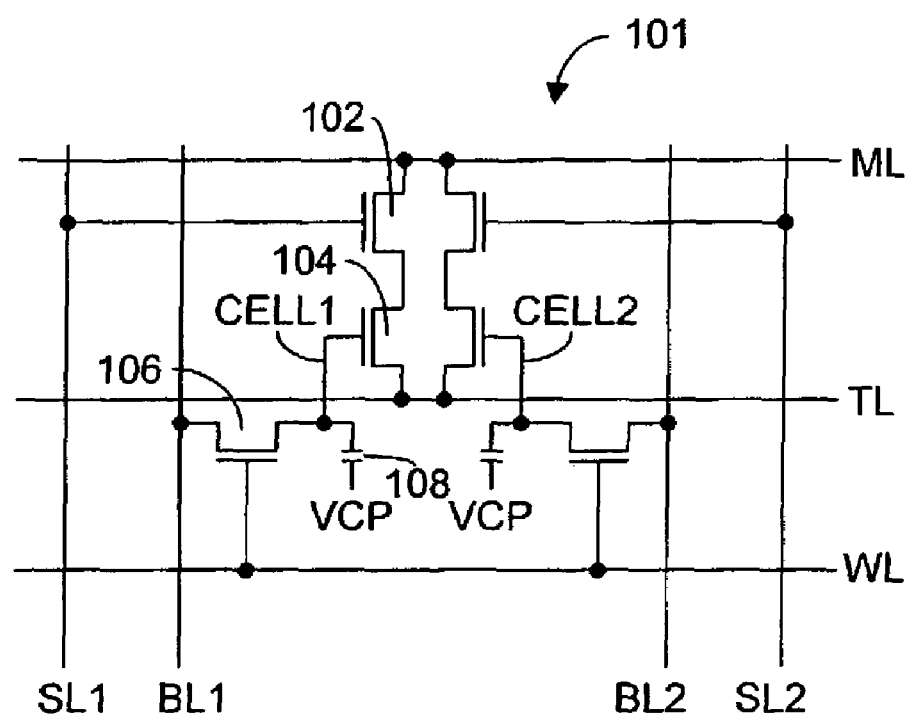
FIG. 2 shows a schematic of a DRAM based CAM cell.

A typical ternary DRAM type CAM cell 101 is shown in FIG. 2. Cell 101 has an n-channel search transistor 102 connected in series with an n-channel compare transistor 104 between a matchline ML and a tail line TL. A search line SL2 is connected to the gate of search transistor 102. N-channel access transistor 106 has a gate connected to a wordline WL and is connected in series with capacitor 108 between bitline BL1 and cell plate voltage potential VCP. Charge storage node CELL1 is connected to the gate of compare transistor 104 to turn on transistor 104 if there is charge stored on capacitor 108 i.e. if CELL1 is logic "1". The remaining transistors and capacitor, replicate transistors 102, 104, 106 and capacitor 108 for the other half of the ternary data bit, and are connected to corresponding lines SL1 and BL2 and are provided to support ternary data storage. Specifically, the three states are stored by CELL1 and CELL2 as follows: (etc. . . . ) 0/0, 0/1, 1/0, 1/1. Lines SL1, SL2, BL1 and BL2 are common to all cells of the column, and lines ML, TL and WL are common to all cells of a word in the row. The tail line TL is typically connected to ground and all the transistors are n-channel transistors. The description of the operation of the ternary DRAM cell is covered in Canadian Patent Application No. 2,266,062 filed Mar. 31, 1999, the contents of which are incorporated herein by reference. In general, for a match between search and stored data, there must be no conduction path between the matchline and the tail line, whereas for a mis-match, conduction will occur between the matchline and the tail line.

A ternary SRAM type CAM cell consists of 2 SRAM cells, to store each half of the ternary bit, and a pair of search transistors and compare transistors which duplicate the function of transistors 102 and 104 in FIG. 2. From the point of view of search operations and matchline functionality, the SRAM cell performs identically to the DRAM type CAM.

Figure 3:
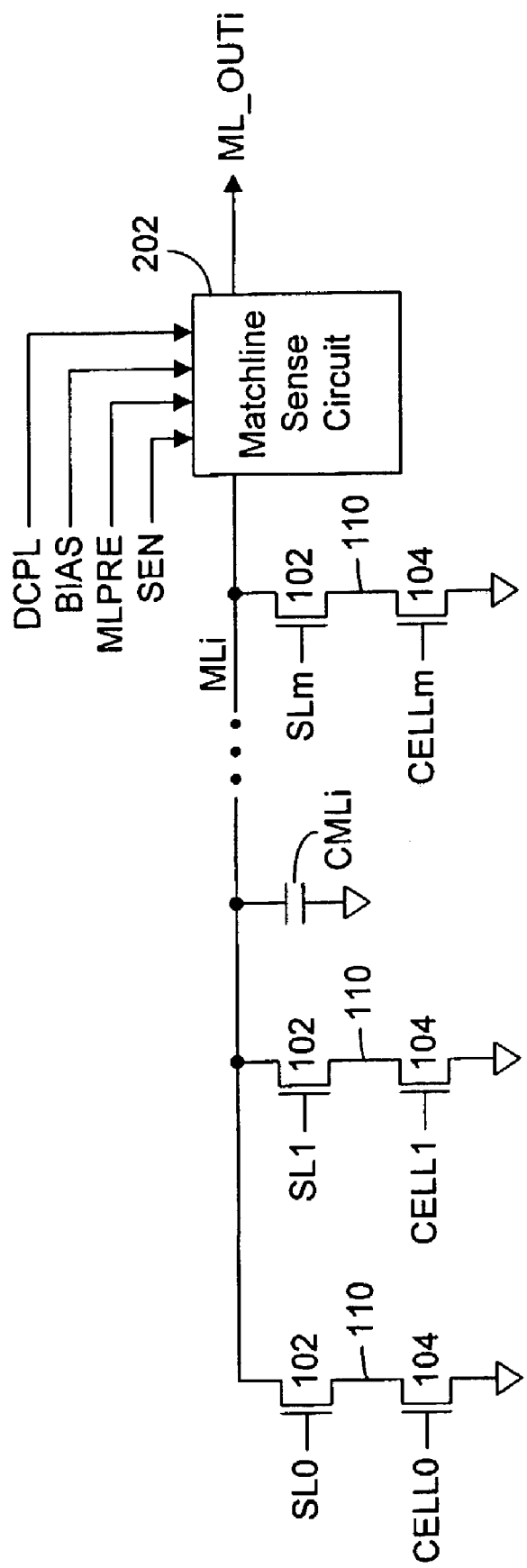
FIG. 3 shows a schematic of a matchline and associated functional circuits/blocks of the prior art.

A simplified row schematic from the CAM array 100 and a corresponding prior art matchline sense circuit 202 from the matchline sense circuits 200 are shown in FIG. 3. The access transistors and storage capacitors from FIG. 2 are not shown. Multiple search and compare transistors (102 and 104 respectively), having gates connected to their respective search line SLj and cell storage node CELLj, are connected in parallel to the common matchline MLi. A matchline sense circuit 202 receives MLi and produces a matchline output ML_OUTi for the row. The matchline sense circuit 202 of the prior art requires control signals DCPL, BIAS, MLPRE and SEN for proper operation. For purposes of comparison with the present invention, a general description of a prior art CAM matchline sensing scheme will now follow with reference to FIGS. 1 to 4. After data is written to the cells 101 of the CAM array 100 via the bitlines, a search for a specific word of data in the cell array can be done. Every matchline MLi of the CAM array 100 is first precharged to a positive voltage level, such as VDD, through activation of a pulsed MLPRE signal. During precharge of the matchline MLi to VDD, all search lines SLj must be grounded to turn off all search transistors 102 of every row, isolating the compare transistors 104 from the matchline MLi, to ensure that the matchlines MLi precharge to the full VDD level once the precharge phase terminates. The search word is then loaded onto the search lines $SL_0$ to SLm and each cell of a word compares its stored data with the data on its respective search line. Any cell whose stored data does not match the data on its search lines SLj, called a mis-match condition, will have both transistors 102 and 104 turned on to form a current path between the matchline MLi and ground. Any cell whose stored data does match the data on its search lines SLj, called a match condition, will have no affect on the matchline MLi. Hence, if each CAM cell of a row has a match condition, then the matchline MLi for the row will remain at the precharge voltage level of VDD. However, if at least one cell of a row has a mis-match condition, the precharge voltage of the matchline MLi will slowly discharge to ground over time. Since the matchline voltage level is neither stable nor suitable for use in subsequent logic circuits, a matchline sense circuit 202 will sense and amplify the matchline voltage level to full CMOS voltage levels, for example. The output of the matchline sense circuit 202, ML_OUTi, at a high logic level will indicate that the data of the respective row matches the search word. ML_OUTi at a low logic level will indicate that the data of the respective row has not matched in at least one bit.

The prior art circuit of FIG. 3 is subject to the previously mentioned disadvantages. Charge sharing of the MLi with nodes 110 between search and compare transistors 102 and 104 respectively, can cause the MLi potential to fluctuate undesirably. The matchline sense circuit 202 may generate a false result of the comparison due to the fluctuating MLi potential.

Figure 4:
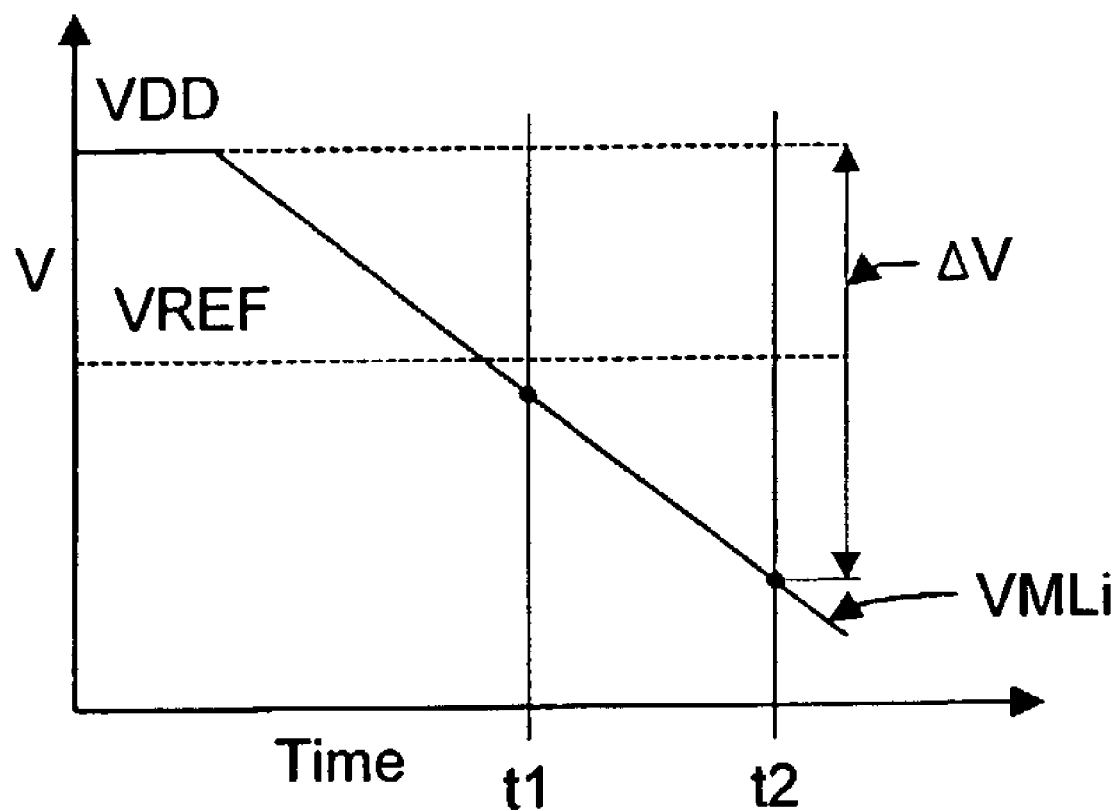
FIG. 4 shows a plot of sense margin voltage versus time for the schematic of FIG. 3.

The time required by the matchline sense circuit 202 to sense the MLi potential is lengthy. FIG. 4 is a plot of the matchline voltage VMLi as a function of time in the case where a current path is formed between the matchline and ground (in the mis-match condition). The matchline sense circuit 202 compares VMLi to a reference voltage VREF at a predetermined time, to sense if VMLi is above or below VREF. Matchline sense circuit 202 will generate a high logic level ML_OUTi if VMLi is above VREF, and a low logic level ML_OUTi if VMLi is below VREF. Sensing can be performed at time t1, but the sense margin is very small and a precise VREF voltage generator is required. A better sense margin can be achieved at later time t2 without the need for a high precision VREF voltage. However, the time between the start of VMLi falling to t2 is wasteful because the CAM remains idle while waiting for the result of the comparison. Contributing to the prolonged sense time is the minimum feature size of search and compare transistors 102 and 104. One conducting pair of search and compare transistors 102 and 104 has a small current capacity, hence the discharge of MLi (which begins in a high precharged state) to ground is very slow. Shrinking feature sizes will extend the optimal sense time past t2 because the discharge rate of VMLi will be further diminished.

After sensing occurs at time t2, all discharged matchlines MLi must be precharged back to the VDD voltage supply by an amount of ΔV. All searchlines SLj must be grounded during MLi precharge before selected searchlines SLj are raised to the VDD supply for the sensing operation. Hence, power consumption will be high due to the repeated discharge and precharge of matchlines MLi and searchlines SLj.

Reference will now be made to embodiments of the invention. Generally, the sensing circuit of the present invention is a low power matchline sense circuit for fast detection of a match between a search word and a stored word in the CAM cell array 100. This is achieved by setting all matchlines to the default miss voltage level and only pulling up the matchlines with a match to the hit voltage level. The matchline sense circuit 200 of the present invention employs a self-timing circuit to generate a control signal. The control signal is self activated after a predetermined amount of time to end sensing of the matchlines.

Figure 5:
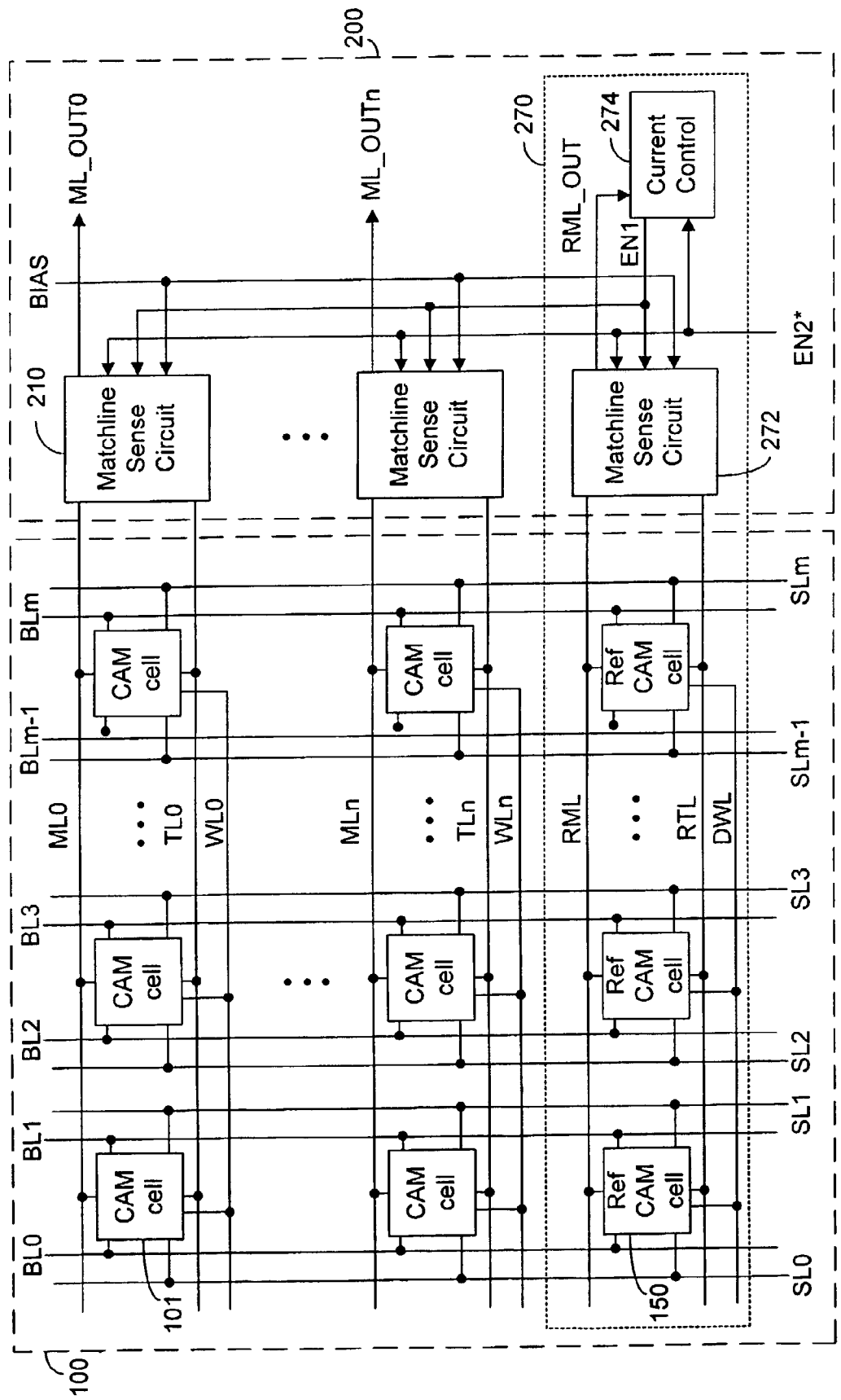
FIG. 5 shows a block diagram of the CAM array and matchline sense circuit block of FIG. 1 in accordance with a first embodiment of the present invention.

FIG. 5 depicts a detailed hierarchical view of the CAM array 100 in accordance with a first embodiment of the present invention. CAM cells 101 of the CAM array 100 are arranged in rows and columns. CAM cells 101 of a row are connected to a common matchline Mli, word line WLi and tail line TLi, and CAM cells 101 of a column are connected to a common pair of search lines SLj and a common pair of bitlines BLj, where i is an integer value between 0 and n, and j is an integer value between 0 and m. Matchlines MLi and tail lines TLi are connected to their respective matchline sense circuits 210. The matchline sense circuits 210 also receive control signals EN1, EN2* and BIAS, and produce a match signal ML_OUTi for its respective row.

At least one row of the CAM array 100 is a reference matchline row 270 having dummy components constructed identically to the components of a normal matchline ML and matchline sense circuit 210. The reference matchline 270 will act as a timing circuit in this embodiment as will be described in more detail below. The reference matchline row 270 will have a dummy sense, or matchline, a dummy current source, dummy cells, a dummy tail line and a dummy matchline sense circuit. The dummy matchline sense circuit will include a dummy current source. In FIG. 5, the dummy match line is a reference matchline RML, the dummy cells are reference CAM cells 150, the dummy tail line is a reference tail line RTL, and the dummy matchline sense circuit is a reference matchline sense circuit 272. The dummy current source is a current source of the reference matchline sense circuit 272. The reference matchline sense circuit 272 receives the same control signals as matchline sense circuits 210 but inputs the reference match signal RML_OUT to a current control circuit 274. The current control circuit 274 acts as a feedback circuit which also receives control signal EN2* and generates the EN1 control signal.

The reference matchline row 270 generates a self-timed control signal, EN1 for controlling all the matchline sense circuits 210. The time required for RML to rise between ground and a predetermined voltage level will be used as a reference time to compare normal matchline ML rise times between ground and the same predetermined voltage level. A matchline sense circuit 210 will therefore determine if its corresponding matchline ML rises at the same rate as the reference rise time, or at a slower rate than the reference rise time. This comparison is achieved by resetting all matchlines ML to ground at a cut-off time signalled by EN1 after RML reaches the predetermined voltage level. At this cut-off time, any matchline ML voltage rising at the same rate as the RML voltage will be detected by its corresponding matchline sense circuit 210 for output of an appropriate signal. All slower rising matchlines ML will not have reached the predetermined voltage level.

Figure 6:
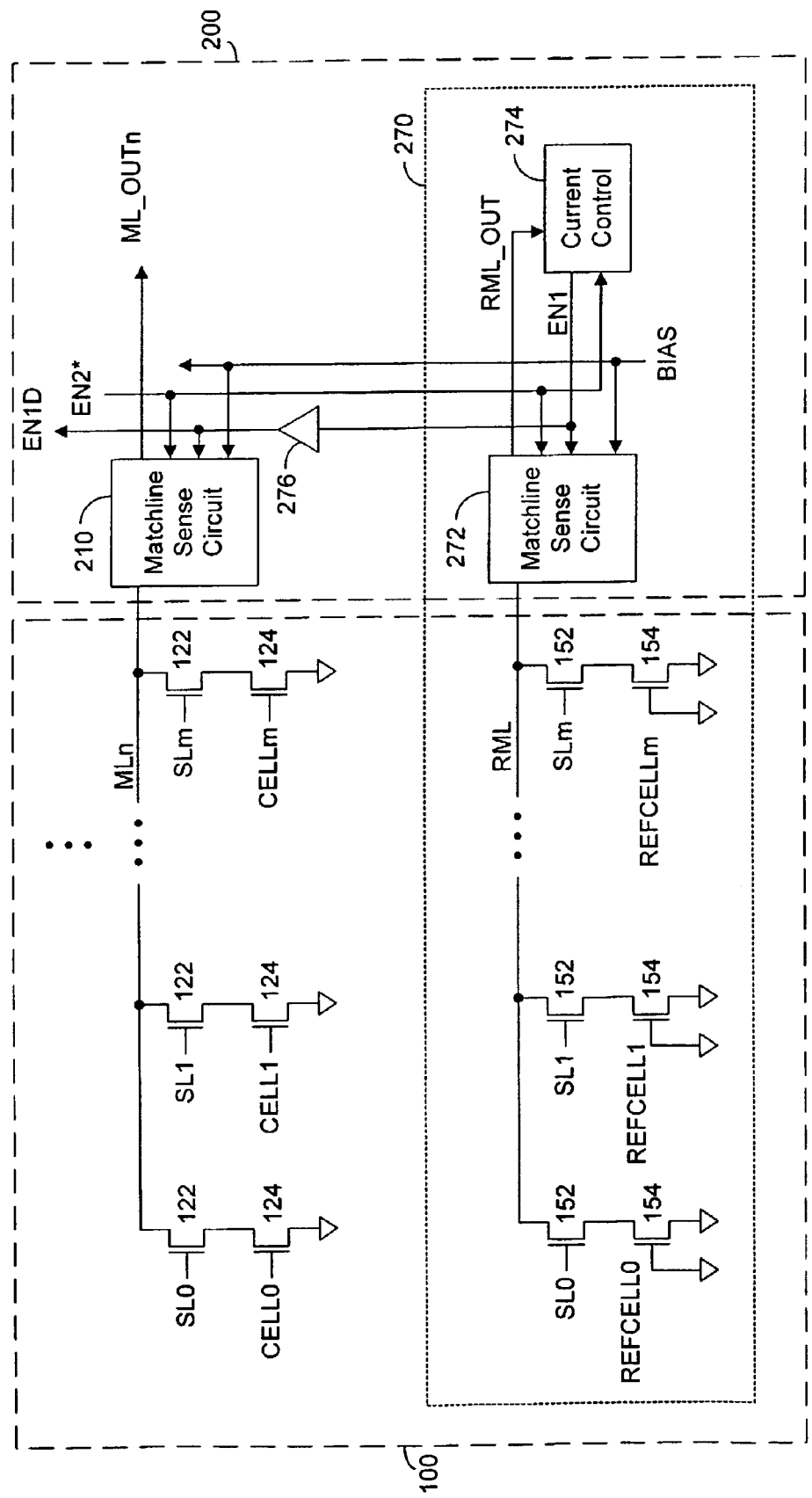
FIG. 6 shows a schematic a CAM array matchline circuitry and reference matchline circuitry in accordance with a second embodiment of the present invention.

A detailed schematic of one matchline and associated circuitry from the CAM array 100 and the reference matchline row 270 is shown in FIG. 6 according to a second embodiment of the present invention. Only the search transistor 122 and compare transistor 124 from the CAM cell 101 (FIG. 5), and the search transistor 152 and compare transistor 154 from the reference CAM cell 150 (FIG. 5), are shown to simplify the schematic. The search and compare transistors 122, 152 and 124 operate in the same fashion as the prior art search and compare transistors from FIG. 3, however, compare transistors 154 are configured such that their gates are wired to ground. In such a configuration, reference matchline RML will never be connected to ground by the reference CAM cells 150. With the exception of control signal EN1D, all remaining control signals are configured identically to the scheme shown in FIG. 5. Control signal EN1D is a non-inverted version of control signal EN1 delayed by buffer 276. Buffer 276 can be any even number of inverters or inverting logic elements, for example, for coupling EN1D to EN1. Note that signal EN1D is used to control all other matchline sense circuits 210 to simultaneously enable and disable all the matchline sense circuits. The delay of EN1 (EN1D) ensures that all matchlines with voltages rising at the same rate as the reference matchline RML will have been detected prior to being reset.

Figure 7:
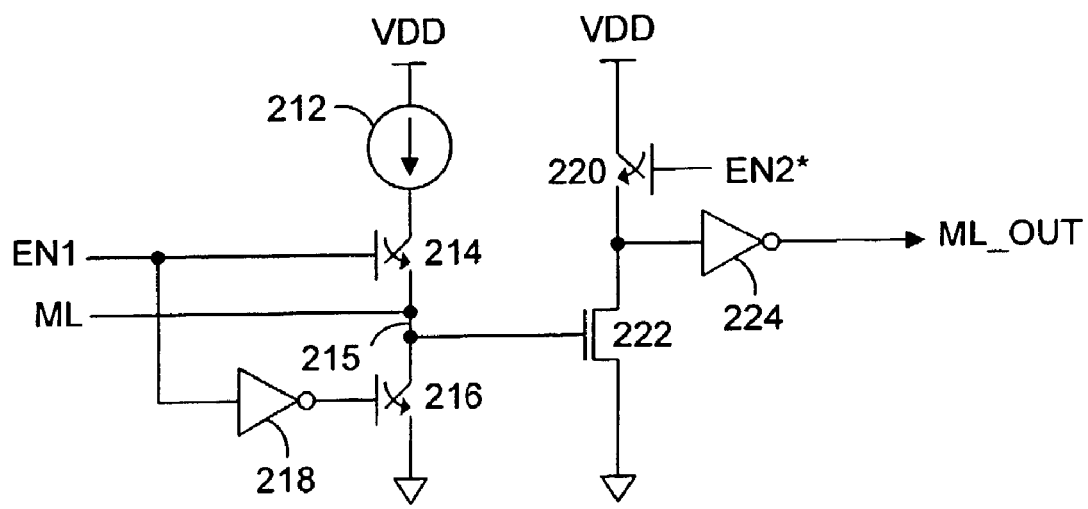
FIG. 7 shows a generic schematic of a matchline sense circuit in accordance with a third embodiment of the present invention.

FIGS. 7–10 show different circuit embodiments of the matchline sense circuit 210 and the reference matchline sense circuit 272. The matchline sense circuit 210 and the reference matchline sense circuit 272 will use the same circuit embodiments shown in FIGS. 7–10. FIG. 7 shows a generic schematic of a matchline sense circuit in accordance with the present invention. The matchline sense circuit has a current source 212 connected to a high voltage supply, such as VDD for example, and is connected in series with switch 214. Switch 216 is connected in series between switch 214 and a low voltage level, such as ground. Signal EN1 controls switch 214, and is inverted by inverter 218 to control switch 216. The matchline ML is connected to common node 215 of switches 214 and 216, and is further connected to the gate of n-channel sense transistor 222. Sense transistor 222 is connected in series between precharge switch 220 and the ground level, where signal EN2* controls precharge switch 220. The input of inverter 224 is connected to the drain of sense transistor 222 and its output is used to generate signal ML_OUT. The circuit combination of switch 220, sense transistor 222 and inverter 224 acts as a sense amplifier to sense and amplify the state of the matchline ML.

The matchline sense circuit operation of FIG. 7 will now be described. Switch 216 is closed, or turned on during a precharge phase, such that the matchline ML is precharged to a low potential level such as ground to turn off sense transistor 222. Switch 214 is open to restrict the application of current to the matchline ML. Also during the precharge phase, switch 220 is closed and the input to inverter 224 is charged to the VDD level, or the high logic level. ML_OUT is therefore at the low logic level. During the course of a search and compare operation, in the sensing phase, switches 216 and 220 are opened, or turned off, and switch 214 is closed to turn on the current source 212, to apply current to the matchline ML. Application of current to the matchline ML by the current source 212 will eventually raise its voltage level over time. When the voltage level of ML reaches the threshold voltage (minimum voltage required to turn on a transistor) for the n-channel sense transistor 222 of about 0.7V, transistor 222 will turn on to connect the input of inverter 224 to ground. ML_OUT subsequently becomes a high logic level. To reset the circuit to the precharge phase, control signal EN1 will become inactive to turn off switch 214 and to turn on switch 216 after a predetermined duration of time. This time is set by a reference matchline sense circuit which will be discussed in more detail later. In summary, the matchline sense circuit 210 of FIG. 5 will determine the potential level of matchline ML relative to the threshold potential level of sense transistor 222. If this voltage level on ML is detected, then signal ML_OUT becomes a high logic level, which can be used by subsequent logic circuits.

Figure 8:
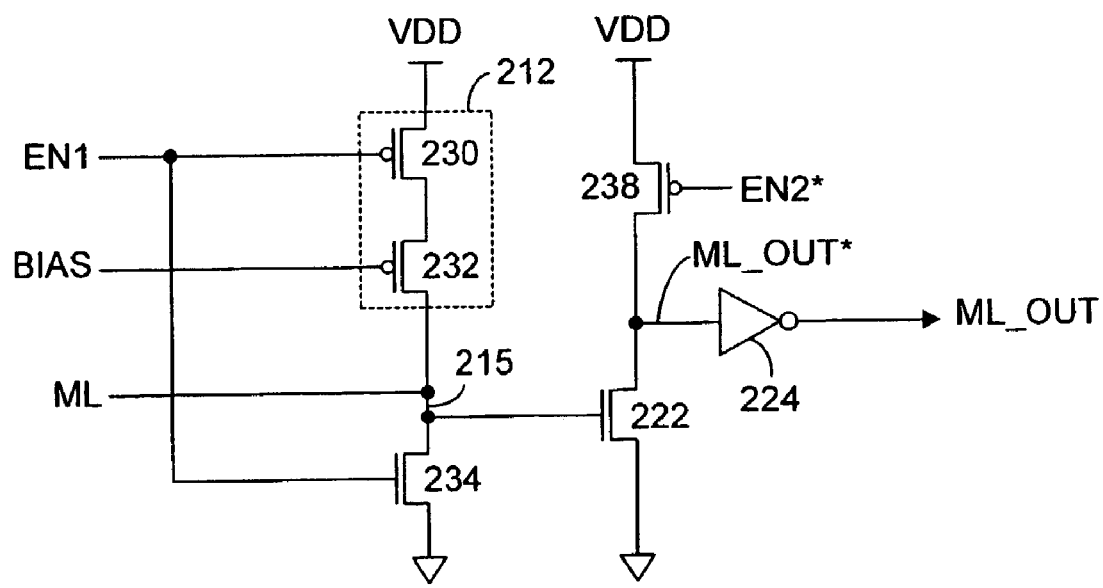
FIG. 8 shows a schematic of a matchline sense circuit in accordance with a fourth embodiment of the present invention.

The matchline sense circuit of FIG. 8 is a practical CMOS implementation of the generic circuit of FIG. 7. Current source 212 is replaced with p-channel transistors 230 and 232, and switches 216 and 220 are replaced with n-channel transistor 234 and p-channel transistor 238 respectively. Inverter 218 can be removed from the circuit since p-channel transistor 230 and n-channel transistor 234 form a complementary pair. An analog BIAS voltage is applied to the gate of p-channel transistor 232 to control the current supplied to the matchline ML.

In the operation of the matchline sense circuit of FIG. 8, signal EN1 is at a high logic level and EN2* is pulsed to a low logic level during a precharge phase to turn on transistors 234 and 238 respectively, such that the matchline ML is connected to ground to turn off sense transistor 222. To ensure that no current is applied to the matchline ML during the precharge phase, the high logic level EN1 will turn off p-channel transistor 230 of the current source. With the input to inverter 224 charged to the VDD level, or high logic level, ML_OUT is therefore at the low logic level. In the sensing phase, EN1 is at a low logic level to turn on p-channel transistor 230 and to turn off n-channel transistor 234, to allow current source 212 to apply current to the matchline ML. When the voltage level of ML reaches the threshold voltage for the n-channel sense transistor 222 of about 0.7V, transistor 222 will turn on to connect the input of inverter 224 to ground. ML_OUT subsequently becomes a high logic level. The circuit would then be reset in the precharge phase in a manner similar to way the circuit of FIG. 7 is reset.

The current source 212 can also be implemented as a single p-channel transistor with its source connected to VDD, its drain connected the matchline ML, and its gate connected to EN1, eliminating the requirement for the analog BIAS voltage level. In this case the current will be determined solely by the dimensions of the transistor and the VDD supply level.

The floating input of inverter 224 in the circuit of FIG. 8 during the sensing phase before sense transistor 222 turns on is generally undesirable. If the voltage on node ML_OUT* falls below the inverter's switching point, inverter 224 will incorrectly flip and subsequently output a high ML_OUT logic level even though sense transistor 222 is turned off.

Figure 9:
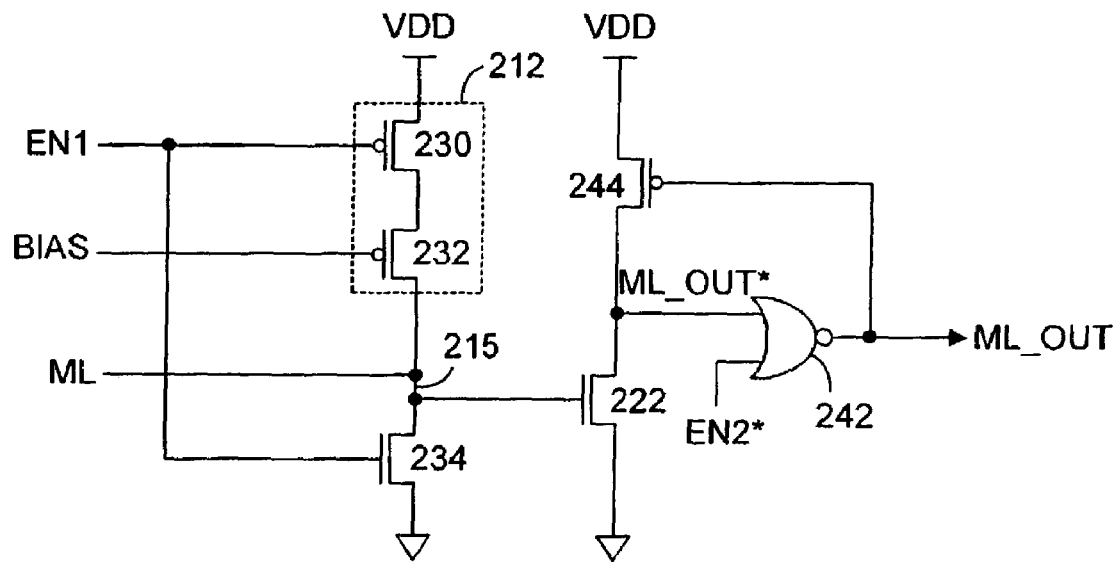
FIG. 9 shows a schematic of a matchline sense circuit in accordance with a fifth embodiment of the present invention.

A modified matchline sense circuit of FIG. 8 is shown in FIG. 9. The configuration of the circuit of FIG. 9 is the same as the circuit of FIG. 8, with the exception of a 2-input NOR gate 242 which replaces inverter 224. NOR gate 242 has a first input connected to the drain of sense transistor 222 and a second input connected to EN2*. The output ML_OUT from NOR gate 242 is also fed back to the gate of p-channel precharge transistor 244. NOR gate 242 and p-channel precharge transistor 244 form a conventional half-latch to hold the drain of sense transistor 222 at the high potential level. Since both p-channel transistor 244 and sense transistor 222 are turned on if the matchline ML reaches the threshold voltage of transistor 222, Vt, p-channel transistor 244 is designed to be weaker than sense transistor 222. This allows sense transistor 222 to override the on state of transistor 244. The circuit of FIG. 9 functions equivalently to the circuit of FIG. 8 during the precharge and sense phases. It should be noted that the half-latch circuit of FIG. 9 is not capable of latching a low logic level on the first input of NOR gate 242 during the sensing phase.

Figure 10:
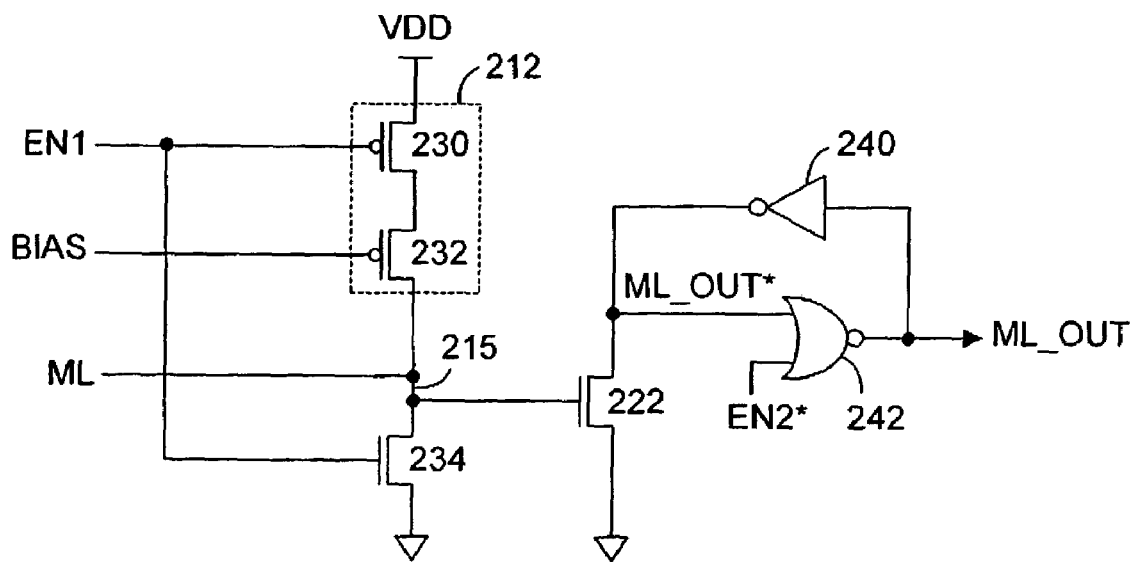
FIG. 10 shows a schematic of a matchline sense circuit in accordance with a sixth embodiment of the present invention.

A modified matchline sense circuit of FIG. 9 is shown in FIG. 10. The configuration of the circuit of FIG. 10 is the same as the circuit of FIG. 9, except a full-latch circuit that replaces the half-latch circuit of FIG. 9. Inverter 240 replaces p-channel transistor 244 from FIG. 9, allowing the full-latch circuit to latch both low and high logic levels on the first input of NOR gate 242. The circuit of FIG. 10 functions equivalently to the circuit of FIG. 9 during the precharge and sense phases.

Figure 13:
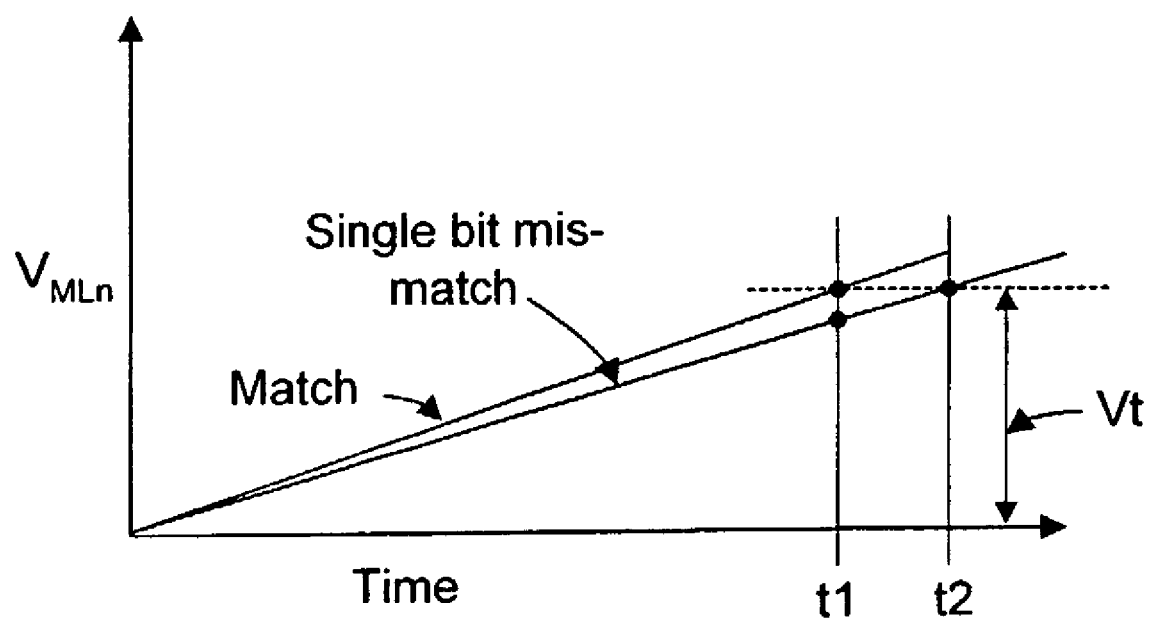
FIG. 13 shows a plot of the matchline voltage versus time for a single mis-match and match conditions.

A description of the matchline sensing operation in accordance with the present invention will now follow with reference to FIGS. 6, 10 and 13. In conjunction with operation of the matchline sense circuit 210, a search word is applied with the appropriate search lines (SL0-SLm) set to the high potential level prior to, or during, the precharge phase. By turning on selected search transistors 122, any previously stored charges at the source drain junctions of transistors 122 and 124 that do not have a discharge path to ground through compare transistors 124, are released to the matchline MLn and immediately transferred to ground via precharge transistor 234 in matchline sense circuit 210. Current is then applied to the matchline MLn during the sensing phase. In the case of a match, no current path is formed between MLn and ground, thus allowing the voltage of MLn to rise quickly over time. In the case of a single bit mis-match, where one current path is formed between MLn and ground through a single pair of transistors 122 and 124, the rate at which the voltage of MLn rises over time is slower than if there were no current path because only a small amount of charge is continually discharged from the matchline MLn by the current path to ground. Therefore the rising rate of the matchline MLn voltage over time is slower than the rising rate in the case where there is a match. This rising rate becomes even slower due to the existence of multiple parallel current paths between the matchline MLn and ground in the case of a multiple bit mis-match in the word, since the current source 212 must overcome multiple pull down paths.

FIG. 13 shows a plot of MLn voltage versus time for the single mis-match case and the match case. From the plot of FIG. 13, the time of interest is at t1, when the match case MLn voltage ramps up to a threshold voltage Vt to turn on sense transistor 222 from the matchline sense circuit 210 of FIG. 10. Although for the single bit mis-match case MLn does not reach the Vt level at t1, it will reach Vt some time after t1 at time t2 to turn on sense transistor 222 erroneously. Hence time t1 is the earliest and most accurate time for detecting a match or mis-match condition for any given row, and it becomes necessary to disable slower ramping matchlines from rising after time t1. Although a linear relationship between the MLn voltage and time is shown, the rising rate of MLn with respect to time does not necessarily have to be linear. In other words, using this process according to the invention, all matchlines begin to rise when current is provided, but depending on the state of each matchline, (i.e. containing a match or a mismatch) each matchline will rise at one of two rates (either at the "hit" or match rate or at a slower mismatch rate). It is important to capture this rate of voltage rise in the matchline circuit and thereafter disable the current source thereby preventing further charging of the mismatched lines and conserving power. The reference matchline 270 from FIGS. 5 and 6 generates a self-timed signal EN1, EN1D for disabling the current sources of all normal rows associated with the reference matchline row, after the sensing phase commences. Once it has sensed a match, it shuts its current source off and all others in the memory array. With the gates of all compare transistors 154 of the reference matchline 270 grounded, the rising rate of the RML voltage will mimic the rising rate of an MLn voltage having a match. By the time RML reaches Vt, all normal rows having a match will also have reached Vt and set their respective ML_OUTn signals to the high logic level. Once RML reaches Vt to turn on sense transistor 222 of matchline sense circuit 272, signal RML_OUT will be set at the high logic level. The current control circuit 274 detects the high logic level of RML_OUT to set EN1 at the high logic level, which in turn, after passing through buffer 276, EN1D resets all matchline sense circuits 210 to the precharge phase, i.e. all current sources 212 are turned off to discontinue the application of current and all matchline precharge transistors 234 are turned on. Therefore, all matchlines (MLn and RML) stop receiving current and accumulated charge is transferred to ground, preventing any mis-match matchlines' voltage levels from rising further after RML has reached the Vt level.

Figure 12:
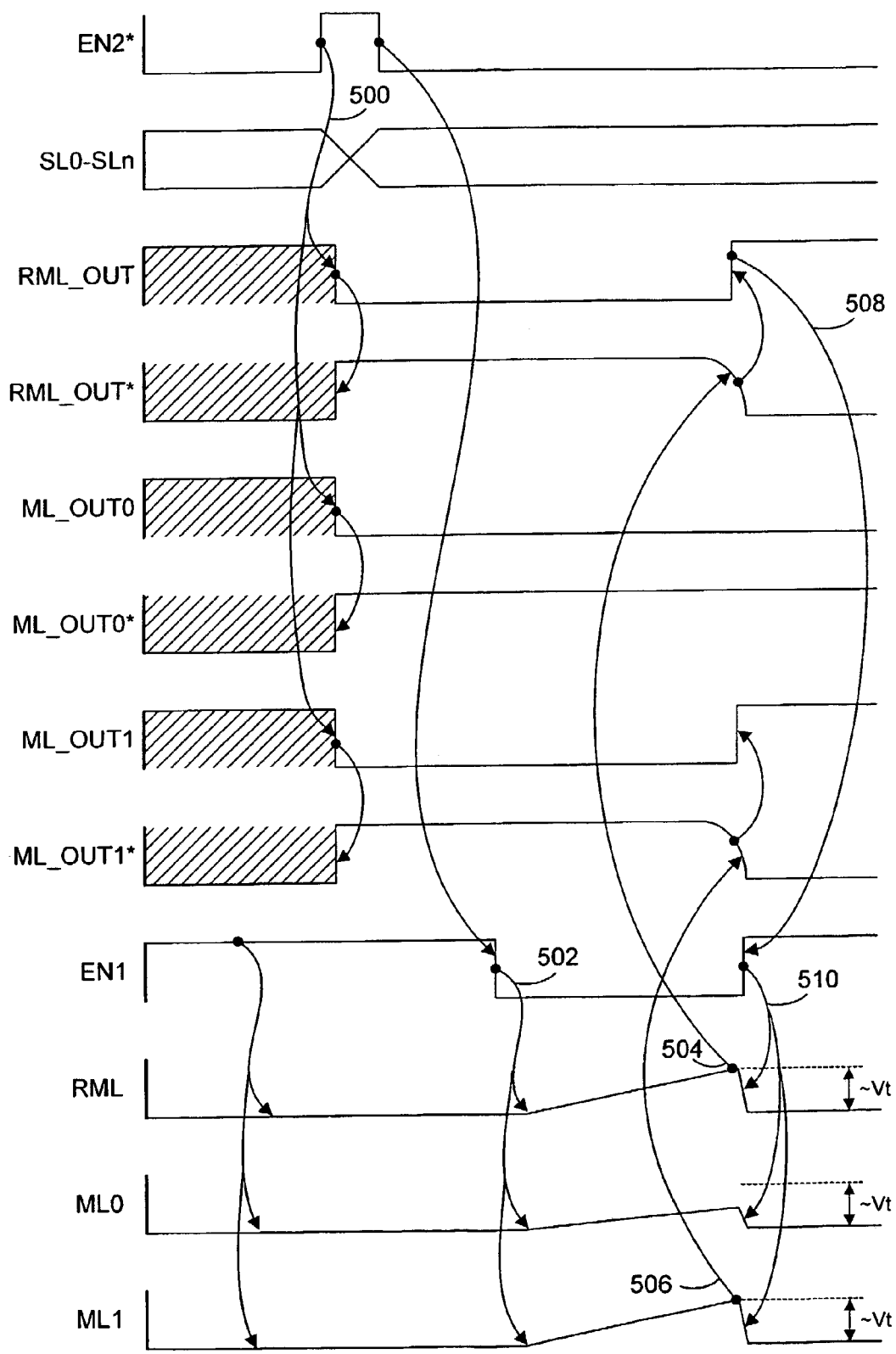
FIG. 12 shows a sequence diagram of the CAM search-and-compare operation according to the present invention.

An example of the matchline sense circuit operation will now be discussed in detail with reference to FIGS. 5, 10 and 12. The sequence diagram shown in FIG. 12 illustrates the logical transitions in the output of two matchlines represented by ML_OUT0 and ML_OUT1, as they are affected by control signals EN2* and EN1, the reference matchline row output RML_OUT, and their respective matchlines ML0, ML1 and RML. ML_OUT0*, MLOUT1* and RML_OUT* are the signal names for the input of NOR gate 242 connected to the drain of sense transistor 222 for each respective row. The beginning of an arrow indicates the signal transition that causes an event, and the end of an arrow indicates the effect of the signal transition on another signal. Hatched lines represent "don't care" states.

In the precharge phase, EN1 remains at the high logic level to keep matchlines ML0, ML1 and reference matchline RML grounded by turning on respective precharge transistors 234. First transition arrow 500 indicates the beginning of the EN2* precharge pulse which simultaneously drives and latches ML_OUT0, ML_OUT1 and RML_OUT to the low logic level, and latches ML_OUT0*, ML_OUT1* and RML_OUT* to the high logic level. While EN1 remains at the high logic level, a search word is introduced to the search lines SL0-SLm to turn on selected search transistors 122 and 152. In this example, the stored word for the row corresponding to ML_OUT0 does not match the search word in at least one bit, and the stored word for the row corresponding to ML_OUT1 will match the search word. EN1 will eventually drop to the low logic level, as indicated by second transition arrow 502, to end the precharge phase and start the sense phase. By enabling the current sources 212 of the matchline sense circuit 210 and reference matchline sense circuit 272, the voltage of RML, ML0 and ML1 will begin to rise. The voltage of ML1 and RML reach the Vt voltage simultaneously to turn on sense transistors 222 of their respective matchline sense circuits 210 and 272. Now RML_OUT* and ML_OUT1* will drop to the low logic level as indicated by third transition arrow 504 and fourth transition arrow 506 respectively. The low logic level transition of RML_OUT* and ML_OUT1* will cause RML_OUT and ML_OUT1 to be latched at the high logic level. The high logic level of ML_OUT1 indicates that the corresponding word stored in the row matches the search word. Because ML0 has not reached the voltage of Vt yet, ML_OUT0 and ML_OUT0* will remain in their precharged logic levels. Upon receiving the high logic level of RML_OUT, the current control circuit 274 will change EN1 to the high logic level at the fifth transition arrow 508. A high logic level EN1 and its delayed version EN1D will turn off all current sources 212 via transistor 230, and turn on all precharge transistors 234 to quickly pull down matchlines ML0, ML1 and RML to ground. The matchline sense circuit is now reset to the precharge phase and ready to perform another sense operation. The reference matchline RML effectively sets the low logic level duration of EN1, giving the circuit a self-timed attribute.

As mentioned previously, the scheme described above is improved by introducing a small delay in the propagation of the high logic level transition of EN1 to ensure that all other matchlines MLn having a match will turn on their respective sense transistors 222 immediately prior to being reset in the precharge phase. FIG. 6 shows a non-inverting buffer 276 inserted into the path of signal EN1 to produce a delayed signal, EN1D. EN1D is received by all matchline rows associated with the reference matchline row 270. The delay provided by buffer 276 can be varied according to design specifications by using any even number of cascaded inverting logic elements. Capacitors in place of buffer 276 will also delay the propagation of EN1.

To obtain high packing density of the CAM array 100, CAM cells 101 and 150 will employ transistors with minimum width/length (W/L) feature sizes. In the case of a single bit mismatch between the search word and the stored word in a row, the pull down strength of one pair of search and compare transistors 122 and 124 is relatively weak since the current capacity of a transistor is directly dependent on its W/L ratio. Hence the difference in rise time between a matchline with a match and a matchline with a single bit mis-match is very small. Therefore it is desirable to have a matchline sense circuit which delays turn on of the sense transistor 222 for as long as possible in the case of a mis-match condition.

Figure 11:
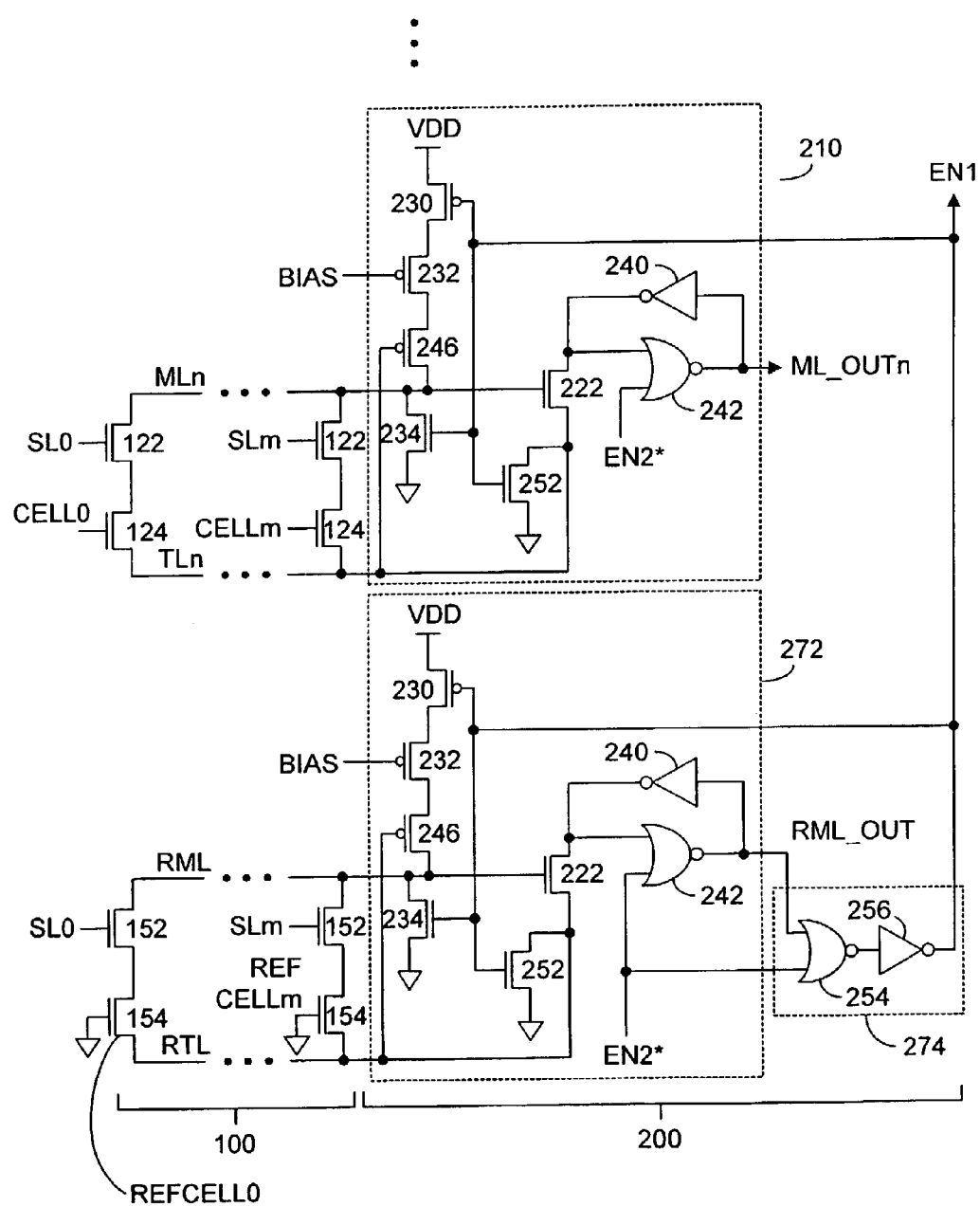
FIG. 11 shows a schematic of a CAM array and matchline sense circuits in accordance with a seventh embodiment of the present invention.

FIG. 11 shows a modified matchline sense circuit of FIG. 10 and a modified matchline row of FIG. 6. According to another embodiment of the invention, compare transistors 124 and 154, and sense transistor 222 are no longer connected to ground potential, but are connected to a tail line TLn common to the row. N-channel tail-line precharge transistor 252 connects the tail-line TLn to ground in response to control signal EN1. Current limiting p-channel transistor 246 is connected in series between transistor 232 and the matchline MLn. The gate of current limiting p-channel transistor 246 is connected to the tail-line TLn. The same modifications are implemented in the reference matchline row 270. Current control circuit 274 is shown to consist of NOR gate 254 and inverter/driver 256. NOR gate 254 receives RML_OUT and EN2* as inputs and drives the input of inverter/driver 256. Inverter/driver 256 generates the EN1 signal.

The operation of the circuits of FIG. 11 will now be described. The precharge phase for matchline sense circuit 210 and reference matchline sense circuit 272 when EN1 is at the high logic level, is the same as previously described for FIGS. 7–10, with the addition of the tail-line TLn also being precharged to the ground potential. During the sense phase, a matchline MLn with no conduction path to the tail-line TLn (match condition) will behave identically as described previously. However, a matchline MLn with at least one conduction path to the tail-line TLn (mis-match condition) will be inhibited from turning on its corresponding sense transistor 222. With TLn coupled to MLn, when a single bit mis-match occurs, current supplied to MLn will also raise the potential level of TLn. Current limiting transistor 246 will start to restrict the current supplied to MLn as the potential level of TLn increases. This effectively increases the time required for MLn to rise to Vt because less current is supplied to MLn. Current limiting transistor 246 remains fully turned on in the match condition for a matchline since TLn remains at the precharged potential level of ground. Additionally, the rising potential of TLn also raises the source potential level of sense transistor 222 to shift the threshold potential of transistor 222 to a higher level. To turn on an n-channel transistor, (Vgate−Vsource) $\geq$ Vtn, where Vgate and Vsource are the transistor gate and source potentials respectively. Thus, if Vsource increases, then Vgate must be at least Vsource+Vtn to turn the transistor on.

Therefore, the delayed rise of the MLn potential level and the upward shift of the threshold potential of sense transistor 222 combine to delay turn-on of sense transistor 222 when at least a single bit mis-match occurs, providing more margin for the matchline sense operation.

The matchline sense circuit of the present invention has the following advantages. Lower power is consumed because matchlines MLn only rise to a Vt and not to a full VDD level before being fully discharged to ground. Since the sensing phase ends after the reference matchline RML reaches the Vt level, the sense operation is fast. Precharging matchlines to ground eliminates the effects of charge sharing to the common source drain node of the search and compare transistors.

Precharging matchlines to the mismatch level rather than the match level allows search data to be present on the search lines and eliminates the need to force search lines to Vss during precharge. This saves significant CV (resulting from the relationship dynamic power=freq.×capacitance×voltage$^2$) power by not charging and discharging search lines during every cycle.

Because the reference matchline row is constructed identically and adjacently to the normal matchline rows, any process variations affecting the CAM array will equally affect the reference matchline row.

A further advantage is a reduction in hot carriers generated in the search and compare devices. Hot carriers are generated when high source drain currents are induced in short channel devices with high source drain potential. This leads to a portion of the source drain current entering the substrate. In the case of a DRAM type CAM this can be a serious problem since carriers in the substrate can corrupt stored data. In the present invention the matchline voltage only reaches the level of an n-channel threshold, rather than VDD as in the prior art, and the hot carrier problem is very much reduced.

Of course, numerous variations and adaptations may be made to the particular embodiments of the invention described above, without departing from the spirit and scope of the invention, which is defined in the claims.

While the matchline sense circuit of the present invention has been implemented and simulated using CMOS technology on silicon, alternative embodiments can be implemented in other technologies such as BiCMOS.

Although the matchline sense circuits of FIGS. 8–10 have been implemented to precharge matchlines to ground, the circuits can be inverted in order to precharge matchlines to the VDD voltage supply. Transistors would be replaced with their respective complementary type of transistor and the voltage supply polarities would be swapped with each other. For example, n-channel transistors would be replaced with p-channel transistors, and p-channel transistors would be replaced with n-channel transistors. The inverted matchline sense circuit would precharge matchlines to the VDD supply voltage and detect falling rates of the matchline. A negative current source will discharge the precharged matchline to ground, and any mismatching cell will form a current path to the VDD supply voltage via a conducting pair of search and compare transistors. Hence in a mismatch condition, the falling rate of the matchline will be slower than the falling rate of a matchline having a match condition.

In addition, a p-channel cell with p-channel search and compare transistors could be contemplated, however the matchline sense circuit will function equally with any type of CAM cell.

This matchline sensing scheme can be used in both SRAM and DRAM based CAMs. The circuit technique disclosed can also be used in flash memory applications where it is necessary to verify that data has been correctly written into the memory. Typical flash cells are programmed by writing a logical 1 into the cell to raise its threshold to a voltage level which is greater than a read voltage applied to the gate of the cell. Hence the cell will not conduct current when the read voltage is applied to its gate. However, if the cell has not been properly programmed, the cell may conduct some current, resulting in incorrect read out of data. Flash memory includes write verification circuitry in which the written logical 1 is read out and compared. If the data read out does not match the written data, then the programming must be repeated until the read out data matches the written data. The circuits of the present invention could be useful to detect faulty bits in a flash memory device.

Additionally, in associative cache memory applications where a microprocessor searches the cache for an address and data it wants to access, a search and compare operation can be implemented, and the results of the search, i.e. a match or miss can be detected using circuits and principles described in this invention.

The above-described embodiments of the invention are intended to be examples of the present invention. Alterations, modifications and variations may be effected the particular embodiments by those of skill in the art, without departing from the scope of the invention which is defined solely by the claims appended hereto.

We claim:

1. A sensing circuit for detecting a voltage, comprising:
a sense line initially precharged to a first voltage level;
a current source operatively connected to the sense line;
a timing circuit for switching the current source between an on state and an off state for ramping the sense line from the first voltage level to a second voltage level; and
a sense amplifier for detecting the second voltage level to provide an output corresponding thereto.

2. A sensing circuit of claim 1, wherein the sense line is precharged by a precharge circuit.

3. A sensing circuit of claim 1, wherein the sense line is precharged to the first voltage level when the current source is in the off state.

4. A sensing circuit of claim 1, wherein the first voltage level is a low voltage level.

5. A sensing circuit of claim 1, wherein the first voltage level is a high voltage level.

6. A sensing circuit of claim 1, wherein the current source includes at least one p-channel transistor connected between a supply voltage and the sense line.

7. A sensing circuit of claim 1, wherein the current source includes at least one n-channel transistor connected series between a supply voltage and the sense line.

8. A sensing circuit of claim 6, wherein the supply voltage is a high voltage level greater than the first voltage level.

9. A sensing circuit of claim 7, wherein the supply voltage is a low voltage level less than the first voltage level.

10. A sensing circuit of claim 1, wherein the second voltage is an n-channel transistor threshold voltage.

11. A sensing circuit of claim 1, wherein the second voltage is a p-channel transistor threshold voltage.

12. A sensing circuit of claim 1, wherein the timing circuit is a reference sensing circuit.

13. A sensing circuit of claim 12, wherein the reference sensing circuit includes:
a dummy sense line initially precharged to the first voltage level;
a dummy current source operatively connected to the dummy sense line, and being controlled by feedback circuit, the feedback circuit switching the dummy current source between the on state and the off state for ramping the dummy sense line between the first voltage level and the second voltage level, in response to a feedback output; and
a dummy sense amplifier for detecting the second voltage level of the dummy sense line, and for providing a dummy sense output signal to the feedback circuit when the second voltage level is detected.

14. A sensing circuit of claim 13, wherein the dummy sense line is precharged by a dummy precharge circuit.

15. A sensing circuit of claim 13, wherein the dummy sense line is precharged to the first voltage level when the dummy current source is in the off state.

16. A sensing circuit of claim 13, wherein the first voltage level is a low voltage level.

17. A sensing circuit of claim 13, wherein the first voltage level is a high voltage level.

18. A sensing circuit of claim 13, wherein the dummy current source includes at least one p-channel transistor connected between a supply voltage and the sense line.

19. A sensing circuit of claim 13, wherein the current source includes at least one n-channel transistor connected between a supply voltage and the sense line.

20. A sensing circuit of claim 18, wherein the supply voltage is a high voltage level greater than the first voltage level.

21. A sensing circuit of claim 19, wherein the supply voltage is a low voltage level less than the first voltage level.

22. A sensing circuit of claim 13, wherein the second voltage is an n-channel transistor threshold voltage.

23. A sensing circuit of claim 13, wherein the second voltage is a p-channel transistor threshold voltage.

24. A sensing circuit of claim 13, wherein transistors of the reference sensing circuit are sized and arranged substantially the same as the transistors of the sensing circuit.

25. A sensing circuit of claim 13, wherein an output of the feedback circuit switches the current source of at least one sensing circuit between the on state and the off state.

26. A sensing circuit of claim 1, wherein the sense amplifier includes a sense transistor coupled between a sense output node and a tail line and having a threshold potential level, the sense transistor being turned on when the sense line potential level reaches the second voltage level.

27. A sensing circuit of claim 26, wherein the sense transistor is an n-channel transistor.

28. A sensing circuit of claim 26, wherein the sense transistor is a p-channel transistor.

29. A sensing circuit of claim 26, including a delay circuit for inhibiting the sense transistor from turning on.

30. A sensing circuit of claim 29, wherein the delay circuit includes a coupling circuit for forming a conduction path between the tail line and ground potential, to increase the threshold potential level of the sense transistor.

31. A sensing circuit of claim 30, wherein the coupling circuit is at least one transistor connected between the tail line and ground potential.

32. A sensing circuit of claim 31, wherein the at least one transistor is an n-channel transistor.

33. A sensing circuit of claim 31, wherein the at least one transistor is a p-channel transistor.

34. A sensing circuit of claim 29, wherein the delay circuit includes a current limiting circuit for reducing the current supplied to the sense line by the current source.

35. A sensing circuit of claim 34, wherein the current limiting circuit is a transistor connected in series with the current source, the transistor restricting the supply of current to the sense line when a conduction path between the tail line and ground potential is enabled.

36. A sensing circuit of claim 35, wherein the transistor is a p-channel transistor and the gate of the p-channel transistor is connected to the tail line.

37. The sensing circuit of claim 1, wherein the output is maintained by a latching circuit.

38. The sensing circuit of claim 37, wherein the latching circuit is a half-latch.

39. The sensing circuit of claim 37, wherein the latching circuit is a full latch.

40. The sensing circuit of claim 1 wherein, a propagation delay circuit delays the timing circuit from switching the current source between the on state and the off state.

41. The sensing circuit of claim 40 wherein, the propagation delay circuit is at least one non-inverting buffer.

42. The sensing circuit of claim 40 wherein, the propagation delay circuit is at least one capacitor.

43. The sensing circuit of claim 30 wherein, the tail line is precharged to the first voltage level.

44. The sensing circuit of claim 43 wherein, the tail line is precharged by a precharge circuit.

45. The sensing circuit of claim 8 wherein, the feedback output is maintained by a latching circuit.

46. The sensing circuit of claim 45, wherein the latching circuit is a half-latch.

47. The sensing circuit of claim 45, wherein the latching circuit is a full latch.

48. A method for detecting a voltage level, comprising the steps of:
   precharging a sense line to a first voltage level;
   ramping the voltage level of the sense line for a predetermined time from the first voltage level to a second voltage level with a current source;
   detecting the second voltage level of the sense line; and
   providing an output corresponding to the detected second voltage level.

49. A method for detecting a match or mis-match condition of a match line, comprising the steps of:
   precharging the match line to a first mis-match voltage level;
   ramping the match line to a second match condition voltage level only in case of a match between search data and data stored in a cell associated with the match line.

50. The method for detecting a match or mis-match condition of match lines of claim 49, wherein the miss-match voltage level is ground.

51. The method for detecting a match or mis-match condition of match lines of claim 49, wherein the miss-match voltage level is VDD.

52. The method for detecting a match or mis-match condition of match lines of claim 49, wherein the hit voltage level is a threshold voltage of an n-channel transistor.

53. The method for detecting a match or mis-match condition of match lines of claim 49, wherein the hit voltage level is a threshold voltage of a p-channel transistor.

* * * * *

UNITED STATES PATENT AND TRADEMARK OFFICE
CERTIFICATE OF CORRECTION

PATENT NO. : 6,987,682 B2  
APPLICATION NO. : 10/258580  
DATED : January 17, 2006  
INVENTOR(S) : Stanley Jeh-Chun Ma et al.

It is certified that error appears in the above-identified patent and that said Letters Patent is hereby corrected as shown below:

Column 15, line 28, (claim 7), delete "series";

Signed and Sealed this

Fifth Day of December, 2006

JON W. DUDAS  
*Director of the United States Patent and Trademark Office*